United States Patent
Badehi

[19]

[11] Patent Number: 6,040,235

[45] Date of Patent: Mar. 21, 2000

[54] METHODS AND APPARATUS FOR PRODUCING INTEGRATED CIRCUIT DEVICES

[75] Inventor: Pierre Badehi, Mobile Post Harei Yehuda, Israel

[73] Assignee: Shellcase Ltd., Jerusalem, Israel

[21] Appl. No.: 08/682,556

[22] PCT Filed: Jan. 10, 1995

[86] PCT No.: PCT/EP95/00097

§ 371 Date: Aug. 19, 1996

§ 102(e) Date: Aug. 19, 1996

[87] PCT Pub. No.: WO95/19645

PCT Pub. Date: Jul. 20, 1995

[51] Int. Cl.[7] .......... H01L 21/301; H01L 21/46; H01L 21/78

[52] U.S. Cl. .......... 438/464; 438/460; 438/462; 438/612; 438/613

[58] Field of Search .......... 438/464, 460, 438/462, 612, 613

[56] References Cited

U.S. PATENT DOCUMENTS

| | | |
|---|---|---|
| 1,658,509 | 2/1928 | Beese . |
| 2,507,956 | 5/1950 | Bruno et al. . |
| 2,796,370 | 6/1957 | Ostrander et al. . |
| 2,851,385 | 9/1958 | Spruance et al. . |
| 3,623,961 | 1/1968 | van Laer . |
| 3,719,981 | 3/1973 | Steitz . |
| 3,908,262 | 9/1975 | Stein . |
| 4,794,092 | 12/1988 | Solomon . |
| 4,862,249 | 8/1989 | Carlson . |
| 4,900,695 | 2/1990 | Takahashi et al. . |

(List continued on next page.)

FOREIGN PATENT DOCUMENTS

| | | |
|---|---|---|
| 211 609 | 2/1987 | European Pat. Off. . |
| 490 739 A1 | 6/1992 | European Pat. Off. . |
| 513 935 A1 | 11/1992 | European Pat. Off. . |
| 514 888 A1 | 11/1992 | European Pat. Off. . |
| 534 598 A1 | 3/1993 | European Pat. Off. . |
| 1591105 | 9/1970 | Germany . |
| 28 51 101 | 1/1980 | Germany . |
| 3830131 | 4/1989 | Germany . |
| 2-17644 | 1/1990 | Japan . |
| 2-191358 | 7/1990 | Japan . |
| WO 85/02283 | of 0000 | WIPO . |
| WO 93/24956 | 12/1993 | WIPO . |
| WO 95/19645 | 7/1995 | WIPO . |

OTHER PUBLICATIONS

Patent Abstracts of Japan, vol. 7, No. 194 (E–195) Jun. 7, 1983 (Mitsubishi Denki KK).

Background Information—R&D 100 Technology's Brightest Stars, Tessera System Building Blocks, San Jose, C.A. 1993.

Tessera Complaint Chip, Technology Overview, Tessera System Building Blocks, San Jose C.A.

D. Richmond, Micro SMT Integrated Circuit Technical White Paper, Micro SMT, Inc. Jan. 25, 1993.

Robert Lefort et al. Flip Chips Improve Hybrid Capability, Hybrid Circuit Technology, May 1990, pp. 44–46.

*Primary Examiner*—Kevin M. Picardat
*Assistant Examiner*—D. Mark Collins
*Attorney, Agent, or Firm*—Merchant & Gould P.C.

[57] ABSTRACT

A method for producing integrated circuit devices including the steps of producing a plurality of integrated circuits on a wafer having first and second planar surfaces, each of the integrated circuits including a multiplicity of pads, wafer-wise attaching to both said surfaces of the wafer a layer of protective material, thereafter partially cutting into the wafer and the protective material attached thereto, thereby to define notches along outlines of a plurality of prepackaged integrated circuit devices, forming metal contacts onto the plurality of prepackaged integrated circuit devices while they are still joined together on the wafer, at least a portion of said metal contacts extending into the notches and thereafter separating the plurality of prepackaged integrated circuit devices into individual devices. Integrated circuits produced according to the method are also disclosed and claimed.

26 Claims, 9 Drawing Sheets

U.S. PATENT DOCUMENTS

| | | |
|---|---|---|
| 4,904,610 | 2/1990 | Shyr . |
| 4,992,908 | 2/1991 | Solomon . |
| 5,038,201 | 8/1991 | Brewer et al. . |
| 5,126,286 | 6/1992 | Chance . |
| 5,135,890 | 8/1992 | Temple et al. . |
| 5,171,716 | 12/1992 | Cagan et al. . |
| 5,185,290 | 2/1993 | Aoyagi et al. . |
| 5,240,588 | 8/1993 | Uchida . |
| 5,269,822 | 12/1993 | Carolan et al. . |
| 5,270,485 | 12/1993 | Jacobsen . |
| 5,376,235 | 12/1994 | Langley . |
| 5,455,455 | 10/1995 | Badehi . |
| 5,532,602 | 7/1996 | Lzang . |

METHODS AND APPARATUS FOR PRODUCING INTEGRATED CIRCUIT DEVICES

FIELD OF THE INVENTION

The present invention relates to methods and apparatus for producing integrated circuit devices and to integrated circuit devices produced thereby.

BACKGROUND OF THE INVENTION

An essential step in the manufacture of all integrated circuit devices is known as "packaging" and involves mechanical and environmental protection of a silicon chip which is at the heart of the integrated circuit as well as electrical interconnection between predetermined locations on the silicon chip and external electrical terminals.

At present three principal technologies are employed for packaging semiconductors: wire bonding, tape automatic bonding (TAB) and flip chip.

Wire bonding employs heat and ultrasonic energy to weld gold bonding wires between bond pads on the chip and contacts on the package.

Tape automatic bonding (TAB) employs a copper foil tape instead of bonding wire. The copper foil tape is configured for each specific die and package combination and includes a pattern of copper traces suited thereto. The individual leads may be connected individually or as a group to the various bond pads on the chip.

Flip chips are integrated circuit dies which have solder bumps formed on top of the bonding pads, thus allowing the die to be "flipped" circuit side down and directly soldered to a substrate. Wire bonds are not required and considerable savings in package spacing may be realized.

The above-described technologies each have certain limitations. Both wire bonding and TAB bonding are prone to bad bond formation and subject the die to relatively high temperatures and mechanical pressures. Both wire bond and TAB technologies are problematic from a package size viewpoint, producing integrated circuit devices having a die-to-package area ratio ranging from about 10% to 60%.

The flip-chip does not provide packaging but rather only interconnection. The interconnection encounters problems of uniformity in the solder bumps as well as in thermal expansion mismatching, which limits the use of available substrates to silicon or materials which have thermal expansion characteristics similar to those of silicon.

SUMMARY OF THE INVENTION

The present invention seeks to provide apparatus and techniques for production of integrated circuit device overcome many of the above limitations and provide integrated circuits of relatively smaller size and weight and enhanced electrical performance.

There is thus provided in accordance with a preferred embodiment of the present invention a method for producing integrated circuit devices including the steps of:
  producing a plurality of integrated circuits on a wafer having first and second planar surfaces, each of the integrated circuits including a multiplicity of pads;
  waferwise attaching to both said surfaces of the wafer a layer of protective material;
  thereafter partially cutting into the wafer and the protective material attached thereto, thereby to define notches along outlines of a plurality of prepackaged integrated circuit devices;
  forming metal contacts onto the plurality of prepackaged integrated circuit devices while they are still joined together on the wafer, at least a portion of said metal contacts extending into the notches; and
  thereafter separating the plurality of prepackaged integrated circuit devices into individual devices.

Throughout the specification and claims, the terms "cutting" and "cut" shall have broader than usual meaning and shall refer to removal of material or separating along a line by any suitable technique, such as, for example, etching, sawing, sandblasting and milling.

It is noted that the term "waferwise" does not require that a whole wafer be so processed at a given time. "Waferwise" applies equally to steps applied to multiple dies prior to dicing thereof.

In accordance with a preferred embodiment of the present invention the step of partially cutting exposes sectional surfaces of the multiplicity of pads.

Preferably the step of partially cutting cuts pads so as to simultaneously define electrical contact regions for both of a pair of adjacent integrated circuits.

Additionally in accordance with a preferred embodiment of the present invention there is provided a method for producing integrated circuit devices including the steps of:
  producing a plurality of integrated circuits on a wafer, each of the integrated circuits including a multiplicity of pads; and
  thereafter partially cutting the wafer, thereby to define notches along outlines of a plurality of integrated circuit, and wherein the step of partially cutting exposes sectional surfaces of the multiplicity of pads.

Preferably the step of partially cutting cuts a plurality of pads including some which communicate with a one of a pair of adjacent integrated circuits and others with communication with another of the pair of adjacent integrated circuits, thereby to define electrical contact regions for both of said pair of adjacent integrated circuits.

In accordance with a preferred embodiment of the present invention there are also provided steps of providing a conductive layer over notched edges of the integrated circuits in electrical communication with the exposed edges of the pads and wherein portions of the conductive layer communicating with separate ones of the multiplicity of pads are electrically separated from one another.

In accordance with a preferred embodiment of the present invention, the step of providing a conductive layer comprises forming a conductive coating also over non-edge portions of the integrated circuit.

Preferably the partially cutting step is carried out at locations whereby the silicon substrate is not exposed at the notched edges of the resulting integrated circuits.

In accordance with a preferred embodiment of the present invention, prior to the partially cutting step, the integrated circuits are surrounded on their planar surfaces by protective insulation layers and on their edges by epoxy.

Preferably a thermal bonding pad is formed on at least one outer planar surface of said integrated circuit devices.

Additionally in accordance with a preferred embodiment of the present invention there is also provided the step of providing an integrally formed ground plane in said integrated circuit devices.

Preferably, the protective layer is transparent to radiation which is used for erasing EPROM devices.

Additionally in accordance with a preferred embodiment of the present invention there is provided apparatus for producing integrated circuit devices including:
  apparatus for producing a plurality of integrated circuits on a wafer having opposite planar surfaces, each of the integrated circuits including a multiplicity of pads;

apparatus for waferwise attaching to both said surfaces of the wafer a layer of protective packaging material; and partially cutting apparatus for thereafter partially cutting the wafer and the protective material attached thereto, thereby to define notches along outlines of a plurality of prepackaged integrated circuit devices;

metal coating apparatus for forming metal contacts onto the plurality of prepackaged integrated circuit devices while they are still joined together on the wafer, at least a portion of the metal contacts extending into the notches; and separating apparatus for thereafter separating the plurality of prepackaged integrated circuit devices into individual devices.

Preferably the partially cutting apparatus exposes sectional surfaces of the multiplicity of pads and cuts pads which communicate with adjacent integrated circuits, thereby to simultaneously define electrical contact regions for the adjacent integrated circuits.

Further in accordance with a preferred embodiment of the invention there is provided apparatus for producing integrated circuit devices including:

apparatus for producing a plurality of integrated circuits on a wafer, each of the integrated circuits including a multiplicity of pads; and partially cutting apparatus for thereafter partially cutting the wafer, thereby to define notches along outlines of a plurality of integrated circuit elements which expose sectional surfaces of the multiplicity of pads.

Preferably, the partially cutting apparatus cuts a plurality of pads including some which communicate with a one of a pair of adjacent integrated circuits and others with communication with another of the pair of adjacent integrated circuits, thereby to define electrical contact regions for both of said pair of adjacent integrated circuits.

In accordance with a preferred embodiment of the present invention there is also provided apparatus for providing a conductive layer over notched edges of the integrated circuit in electrical communication with the edges of the pads and for electrically separating portions of the conductive layer communicating with separate ones of the multiplicity of pads.

Preferably, the conductive layer comprises a conductive coating over more than the edge of the integrated circuit.

Preferably the partially cutting apparatus is operative at locations whereby the silicon substrate is not exposed at the notched edges of the resulting integrated circuits.

Preferably the apparatus of the present invention is operative to carry out any and all of the above-mentioned method steps.

In accordance with a preferred embodiment of the invention there is provided an integrated circuit device constructed according to a method or using apparatus having any of the foregoing features.

Additionally in accordance with a preferred embodiment of the present invention there is provided an integrated circuit device comprising:

an integrated circuit die having top and bottom surfaces formed of electrically insulative and mechanically protective material and electrically insulative edge surfaces having exposed sections of conductive pads and being inclined with respect to the top and bottom surfaces.

Additionally in accordance with a preferred embodiment of the present invention, the integrated circuit device includes an integrally formed thermal contact to a heat sink on an outer planar surface of the device and an integrally formed ground plane.

Preferably conductive strips are formed on the outside surface of the integrated circuit device for interconnecting the exposed sections of conductive pads at a plurality of edges.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Reference is now made to FIGS. 1–15, which illustrate the production of integrated circuit devices in accordance with a preferred embodiment of the present invention.

Figure 1:
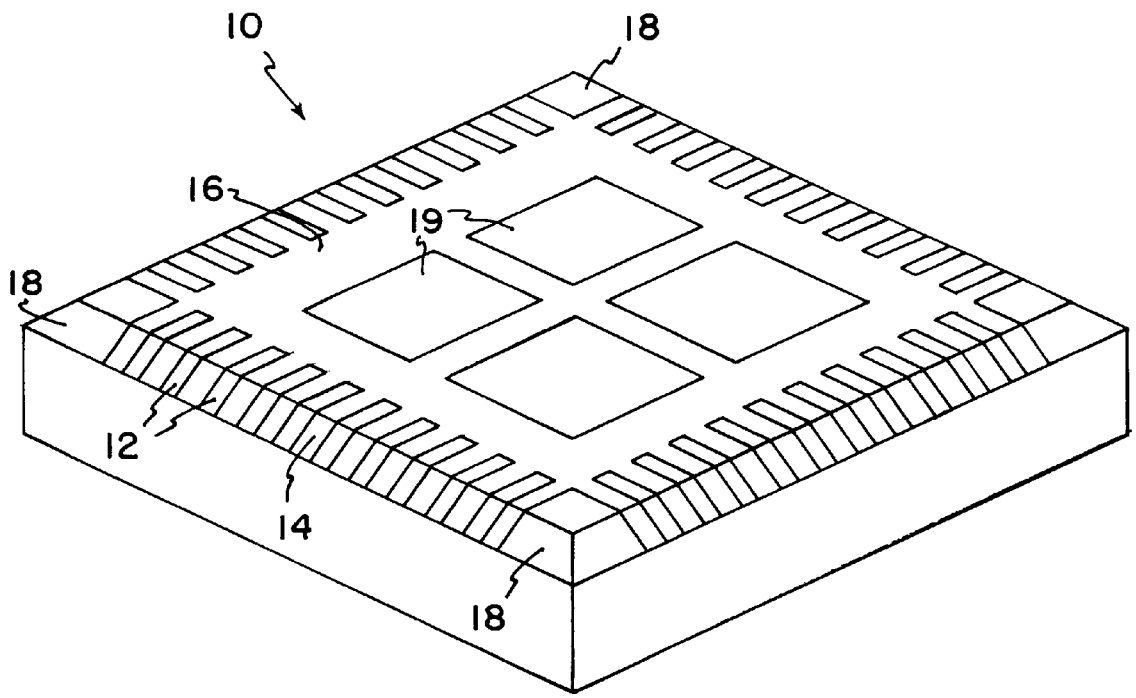
FIG. 1 is a simplified pictorial illustration of an integrated circuit device constructed and operative in accordance with a preferred embodiment of the present invention.

FIG. 1 illustrates a preferred embodiment of integrated circuit device constructed and operative in accordance with a preferred embodiment of the present invention and includes a relatively thin and compact, environmentally protected and mechanically strengthened integrated circuit package 10 having a multiplicity of electrical contacts 12 plated along the edge surfaces 14 thereof. In accordance with a preferred embodiment of the invention, contacts 12 extend over edge surfaces onto the planar surfaces 16 of the package. This contact arrangement permits both flat surface mounting and edge mounting of package 10 onto a circuit board. It is noted that the integrated circuit package 10 may include an integrally formed ground plane (not shown) as well as ground plane contacts 18.

In accordance with a preferred embodiment of the present invention, the integrated circuit package 10 may also include one or more thermal bonding pads 19 formed on one or both of the planar surfaces 16 thereof. The provision of such thermal bonding pads 19 is optional.

Figure 2:
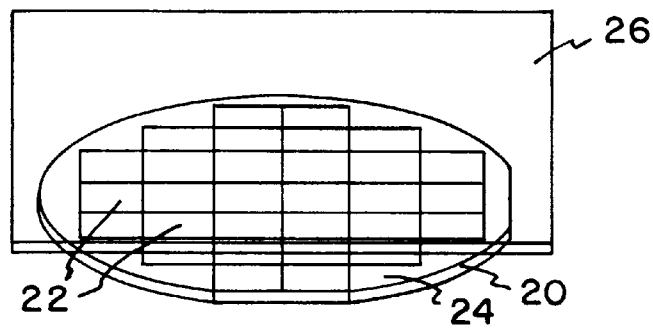
FIG. 2 is a simplified pictorial illustration of the attachment of a protective packaging layer to a wafer containing a plurality of integrated circuit dies.
Figure 4A:
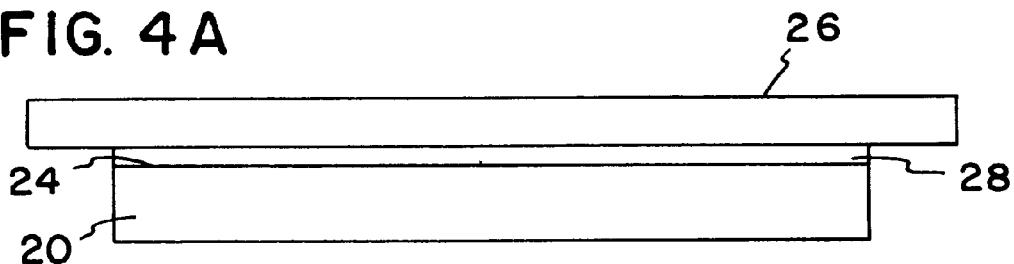
FIGS. 4A, 4B, 4C, 4D and 4E are sectional illustrations of various stages in the manufacture of integrated circuit devices in accordance with a preferred embodiment of the present invention.

In accordance with a preferred embodiment of the present invention, and as illustrated in FIG. 2 and FIG. 4A, a complete silicon wafer 20 having a plurality of finished dies 22 formed thereon by conventional techniques, is bonded at its active surface 24 to an insulating cover plate 26 via a layer 28 of epoxy. The insulating cover plate 26 typically comprises glass, alumina, beryllia, sapphire or any other suitable insulative substrate.

Cover plate 26 may be transparent to radiation in a spectral region useful for optical or infrared alignment.

It is appreciated that certain steps in the conventional fabrication of silicon wafer 20 may be eliminated when the wafer is used in accordance with the present invention. These steps include the provision of via openings above pads, wafer back grinding and wafer back metal coating.

The complete silicon wafer 20 may be formed with an integral ground plane by conventional lithography techniques at any suitable location therein. Alternatively prior to the bonding step of FIG. 4A, a ground plane may be deposited and configured by conventional techniques over the active surface 24, such that the ground plane lies between active surface 24 and the epoxy layer 28.

Figure 4B:
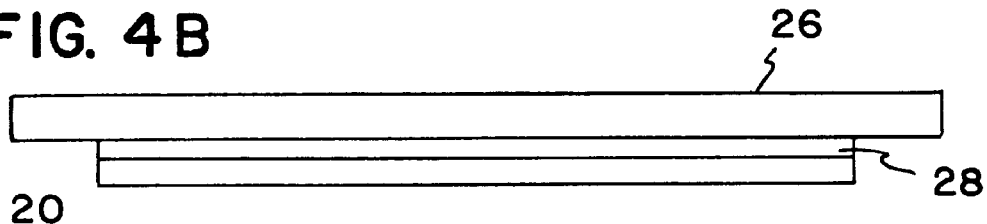

Following the bonding step described hereinabove, the silicon wafer is preferably ground down to a decreased thickness, typically 200 microns, as shown in FIG. 4B. This reduction in wafer thickness is enabled by the additional mechanical strength provided by the bonding thereof of the insulating cover plate 26.

Figure 3:
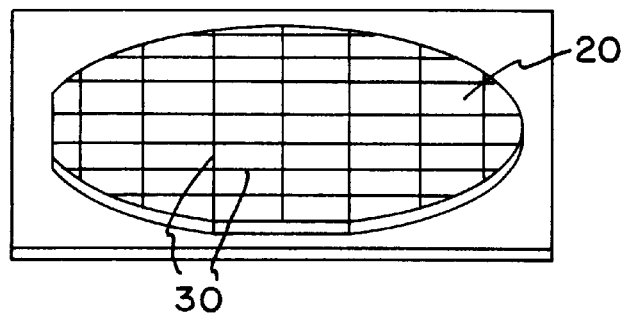
FIG. 3 is a simplified pictorial illustration of scribing of the wafer to define individual dies, following the attachment of a protective packaging layer to the wafer.

Following the reduction in thickness of the wafer, which is optional, the wafer is scribed along its back surface along predetermined dice lines which separate the individual dies. The scribed channels 30 are of sufficient depth to reduce the wafer thickness thereunder to typically 100 microns. The scribed wafer is shown in FIG. 3 and in FIG. 4C.

Figure 4C:
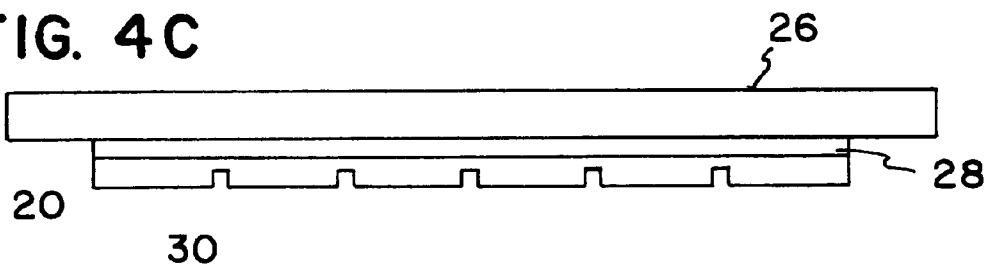
Figure 4D:
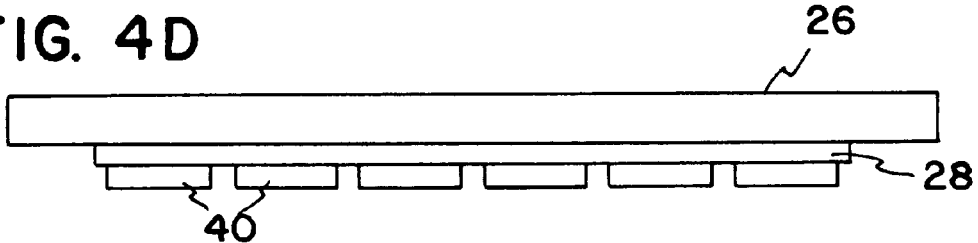

The scribed wafer is then etched in a conventional silicon etching solution, such as a combination of 2.5% hydrofluoric acid, 50% nitric acid, 10% acetic acid and 37.5% water, so as to etch the silicon down to the field oxide layer, as shown in FIG. 4D.

The result of the silicon etching is a plurality of separated dies 40, each of which includes silicon of thickness about 100 microns.

Figure 4E:
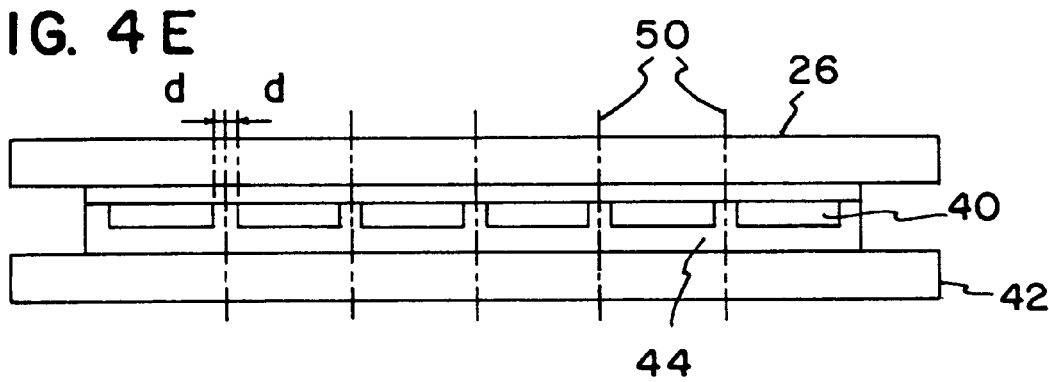

As seen in FIG. 4E, following the silicon etching, a second insulating packaging layer 42 is bonded over the dies 40 on the side thereof opposite to insulating packaging layer 26. A layer 44 of epoxy lies between the dies 40 and the layer 42 and epoxy also fills the interstices between dies 40.

The sandwich of the etched wafer 20 and the first and second insulating packaging layers 26 and 42 is then partially cut along lines 50, lying along the interstices between adjacent dies 40 to define notches along the outlines of a plurality of pre-packaged integrated circuits. It is a particular feature of the invention that lines 50 are selected such that the edges of the dies along the notches are distanced from the outer extent of the silicon 40 by a least a distance d, as shown in FIGS. 4E and 5, to which reference is now additionally made.

It is a particular feature of the present invention that partial cutting of the sandwich of FIG. 4E along lines 50 exposes edges of a multiplicity of pads 34 on the wafer 20, which pad edges, when so exposed, define contact surfaces 51 on dies 40. Partial cutting of the sandwich of FIG. 4E also exposes edge portions of the ground plane 38 which define ground plane contact surfaces 52.

Figure 5:
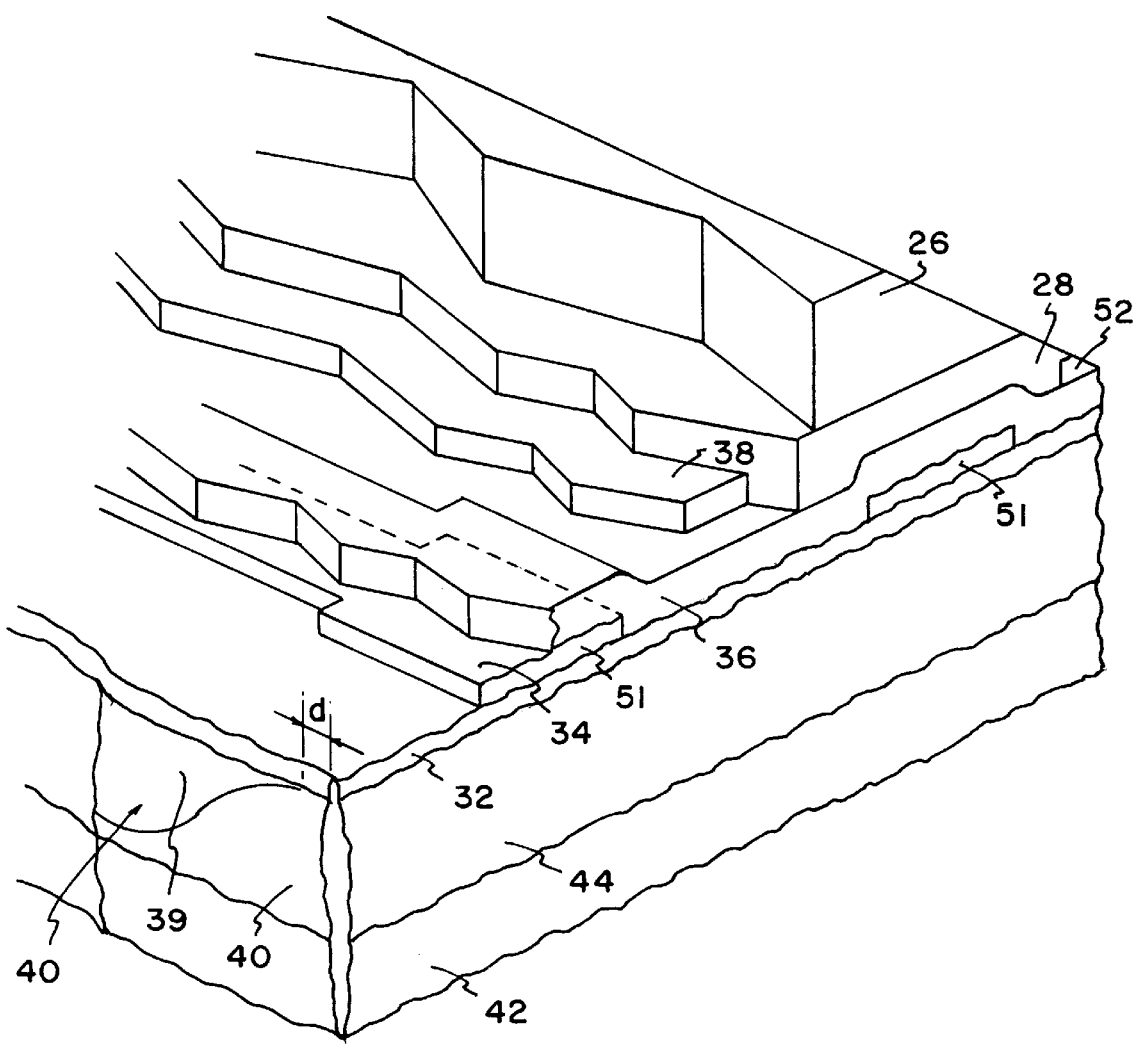
FIG. 5 is a partially cut away detailed pictorial illustration of an integrated circuit device produced from the wafer of FIG. 4E.

Referring now particularly to FIG. 5, at least one insulating layer, including the field oxide layer, is shown at reference numeral 32 and metal pads are shown at reference numeral 34. An over-metal insulating layer is shown at reference numeral 36. The ground plane is shown at reference numeral 38.

It is seen that the notch produced by partial cutting as in FIG. 4E typically as inclined sidewalls, as illustrated in FIG. 5. This need not necessarily be the case, however.

Figure 6:
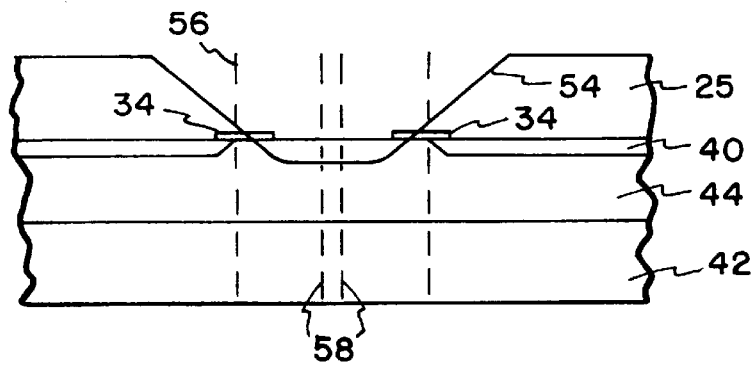
FIGS. 6, 7 and 8 are sectional illustrations of various stages in the manufacture of the integrated circuit device shown in FIGS. 1 & 5.
Figure 7:
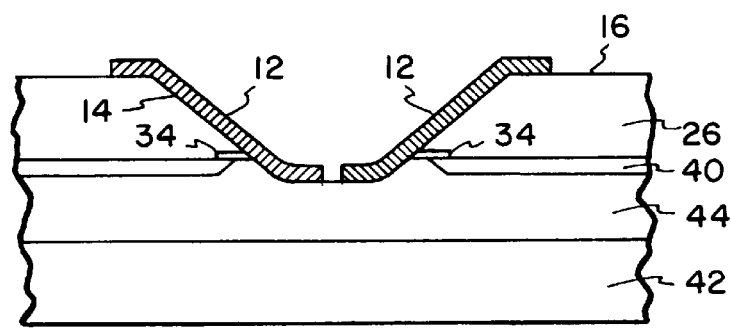
Figure 8:
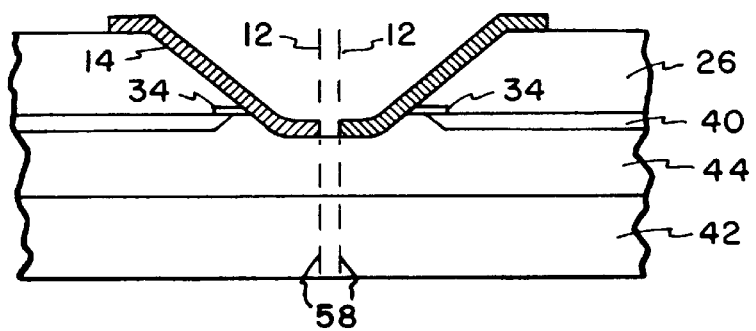

Reference is now made to FIGS. 6, 7 and 8, which illustrate further steps in the manufacture of integrated circuit devices in accordance with a preferred embodiment of the present invention.

FIG. 6 illustrates at reference numeral 54, a preferred cross sectional configuration of a notch produced by partially cutting as described hereinabove in connection with FIG. 4E. Vertical lines 56 indicate the intersection of the notch 54 with the pads 34, defining exposed sectional pad surfaces 51. Vertical lines 58 indicate the location of a subsequent final cut which separates the dies into individual integrated circuits at a later stage.

FIG. 7 illustrates the formation of metal contacts 12 along the inclined edges 14 and part of the top surface 16. These contacts, which may be formed by any suitable metal deposition technique, are seen to extend inside notch 54, thus establishing electrical contact with surfaces 51 of pads 34.

It is a particular feature of the present invention that metal contacts are formed onto the dies in electrical contact with surfaces 51 of pads 34 without first separating the dies into individual chips.

FIG. 8 illustrates subsequent dicing of the individual dies on the wafer, subsequent to metal contact formation thereon, into individual pre-packaged integrated circuit devices.

Figure 9:
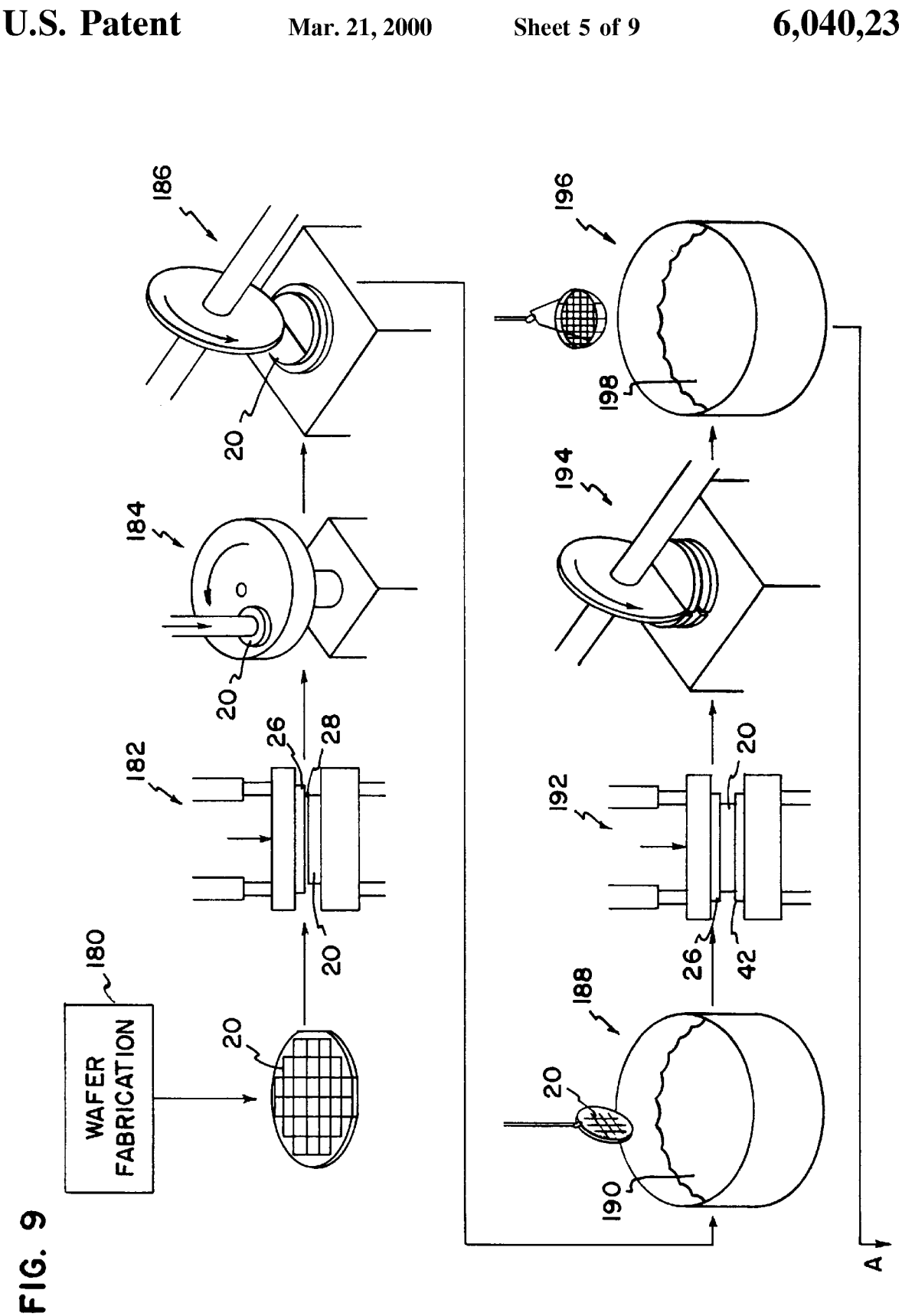
FIGS. 9 and 10 together provide a simplified block diagram illustration of apparatus for carrying out the method of the present invention.
Figure 10:
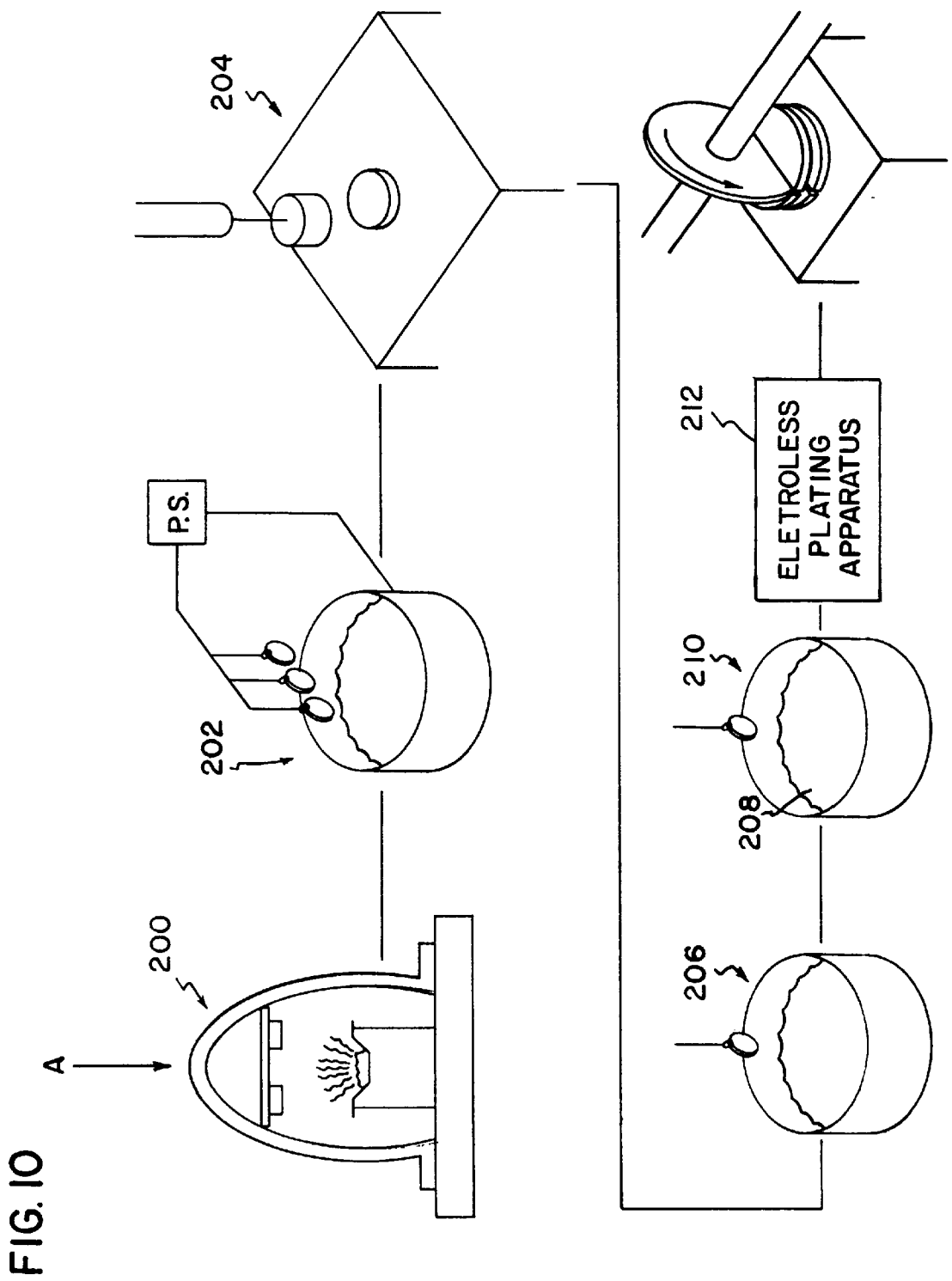

Reference is now made to FIGS. 9 and 10, which together illustrate apparatus for producing integrated circuit devices in accordance with a preferred embodiment of the present invention. A conventional wafer fabrication facility 180 provides complete wafers 20. Individual wafers 20 are bonded on their active surfaces by bonding apparatus 182, preferably having facilities for rotation of the wafer 20, the layer 26 and the epoxy 28 so as to obtain even distribution of the epoxy.

The bonded wafer (FIG. 3) is thinned at its non-active surface as by grinding apparatus 184, such as Model 32BTGW using 12.5A abrasive, which is commercially available from Speedfam Machines Co. Ltd. of England.

The wafer is then scribed at its non-active surface by scribing apparatus 186 such as a Kulicke & Soffa 775 dicing saw employing an Ni plated diamond loaded blade, producing a result which is shown in FIG. 4C.

The scribed wafer of FIG. 4C is then etched in a temperature controlled bath 188 containing a silicon etch solution 190. Commercially available equipment for this purpose include a Chemkleen bath and an WHRV circulator both of which are manufactured by Wafab Inc. of the U.S.A. A suitable conventional silicon etching solution is Isoform Silicon etch, which is commercially available from Micro-Image Technology Ltd. of England. The wafer is conventionally rinsed after etching. The resulting etched wafer is shown in FIG. 4D.

The etched wafer is bonded on the non-active side to another protective layer 42 by bonding apparatus 192, which may be essentially the same as apparatus 182, to produce a doubly bonded wafer sandwich as shown in FIG. 4E.

Notching apparatus 194, which may be identical to apparatus 186, partially cuts the bonded wafer sandwich of FIG. 4E to a configuration shown in FIG. 5.

The notched wafer is then subjected to anti-corrosion treatment in a bath 196, containing a chromating solution 198, such as described in any of the following U.S. Pat. Nos.: 2,507,956; 2,851,385 and 2,796,370, the disclosure of which is hereby incorporated by reference.

Conductive layer deposition apparatus 200, which operates by vacuum deposition techniques, such as a Model 903M sputtering machine manufactured by Material Research Corporation of the U.S.A., is employed to produce a conductive layer on one or more surfaces to each die of the wafer as shown in FIG. 7.

Configuration of contact strips, as shown in FIG. 7, is carried out preferably by using conventional electro-deposited photoresist, which is commercially available from DuPont under the brand name Primecoat or from Shipley, under the brand name Eagle. The photoresist is applied to the wafers in a photoresist bath assembly 202 which is commercially available from DuPont or Shipley.

The photoresist is preferably laser configured by a suitable laser scanner 204 to define suitable etching patterns. The photoresist is then developed in a development bath 206, and then etched in a metal etch solution 208 located in an etching bath 210, thus providing a conductor configuration such as that shown in FIG. 1.

The exposed conductive strips shown in FIG. 7 are then plated, preferably by electroless plating apparatus 212, which is commercially available from Okuno of Japan.

The wafer is then diced into individual pre-packaged integrated circuit devices. Preferably the dicing blade 214 should be a diamond resinoid blade of thickness 4–12 mils. The resulting dies appear as illustrated generally in FIG. 1.

Figure 11:
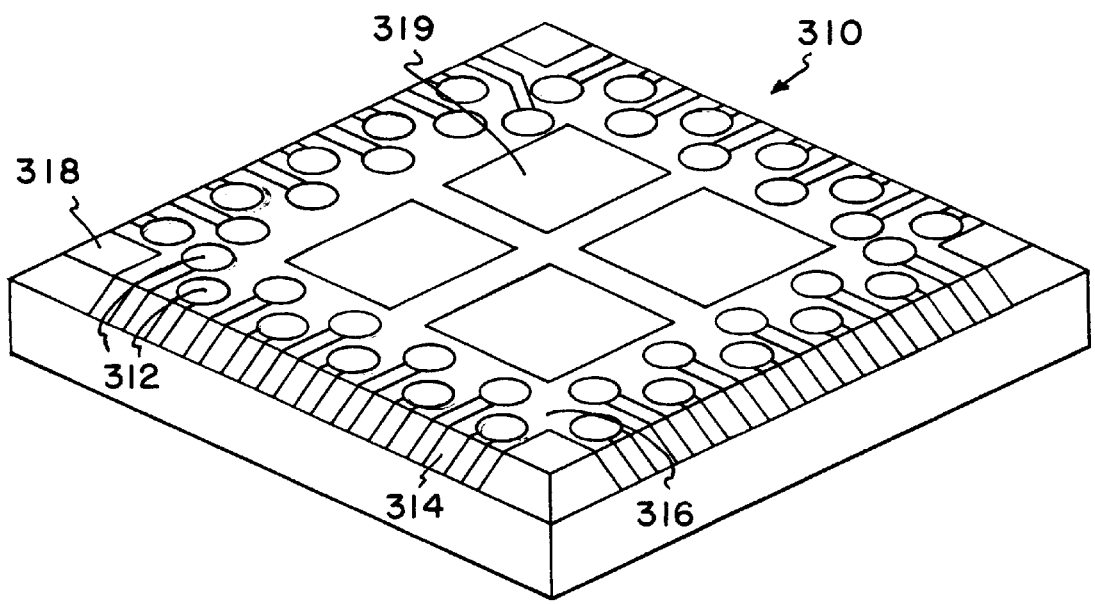
FIG. 11 is a simplified pictorial illustration of an integrated circuit device constructed and operative in accordance with another preferred embodiment of the present invention and having multiple rows of pads arranged on a planar surface thereof.

Reference is now made to FIG. 11, which illustrates a preferred embodiment of integrated circuit device constructed and operative in accordance with another preferred embodiment of the present invention and includes a relatively thin and compact, environmentally protected and mechanically strengthened integrated circuit package 310 having a multiplicity of electrical contacts 312 plated along the edge surfaces 314 thereof. Similarly to the embodiment of FIG. 1, contacts 312 extend over edge surfaces onto the planar surfaces 316 of the package. It is a particular feature of the embodiment of FIG. 11, that a relatively large number of contacts 312 is provided on planar surface 316, preferably by arranging them in multiple rows as illustrated. It is seen that the cumulative width of the contacts 312 may be greater than the overall edge length of the chip, without violating design rules. This is accomplished by staggering the placement of the contacts 312 as shown.

The package may include ground plane contacts 318 as well as one or more thermal bonding pads 319 formed on one or both of the planar surfaces 316 thereof. The provision of such thermal bonding pads 319 is optional.

Figure 12:
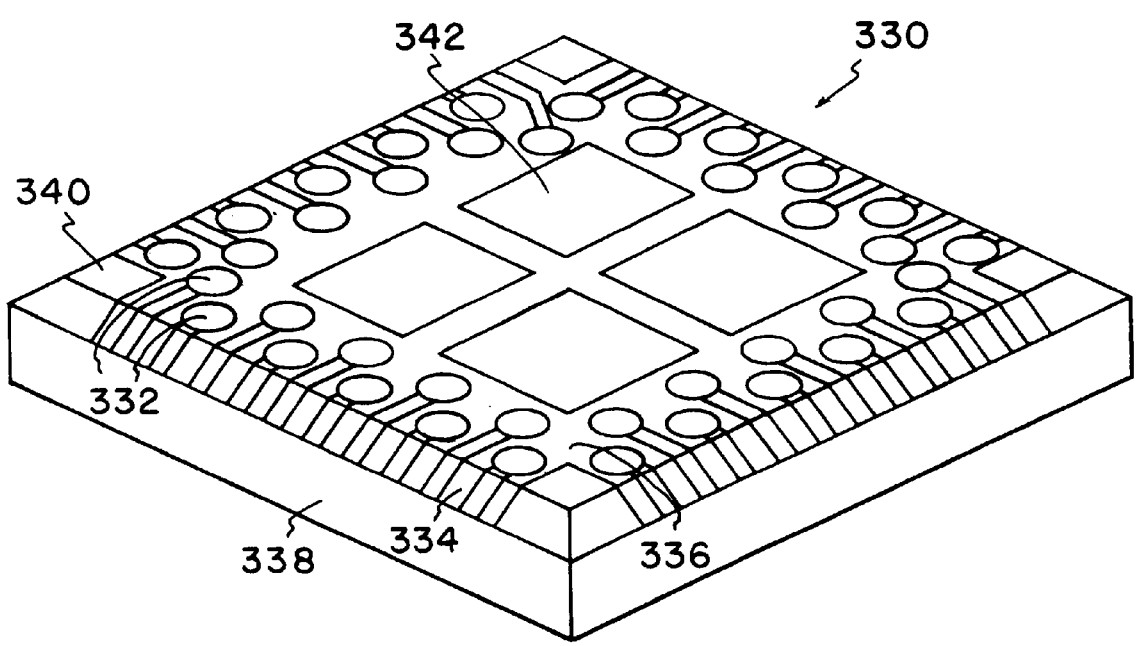
FIG. 12 is a simplified pictorial illustration of an integrated circuit device constructed and operative in accordance with yet another preferred embodiment of the present invention and pads extending to edge surfaces thereof.

Reference is now made to FIG. 12, which illustrates a preferred embodiment of integrated circuit device constructed and operative in accordance with another preferred embodiment of the present invention and includes a relatively thin and compact, environmentally protected and mechanically strengthened integrated circuit package 330 having a multiplicity of electrical contacts 332 plated along the edge surfaces 334 thereof. Similarly to the embodiment of FIG. 11, contacts 332 extend over edge surfaces onto the planar surfaces 336 of the package. A relatively large number of contacts 332 may be provided on planar surface 336, preferably by arranging them in multiple rows as illustrated. In this illustrated embodiment, it is a particular feature that the contacts 332 extend beyond edge 334 onto perpendicular edge surfaces 338, which extend perpendicular to planar surface 336.

The package may include ground plane contacts 340 as well as one or more thermal bonding pads 342 formed on one or both of the planar surfaces 336 thereof. The provision of such thermal bonding pads 342 is optional.

Figure 13:
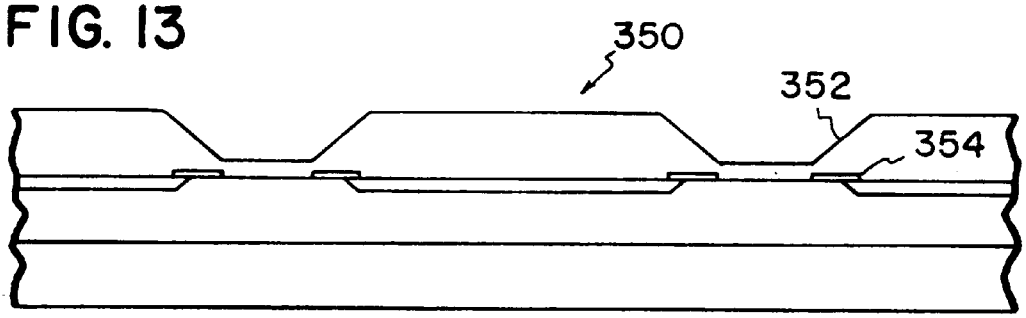
FIGS. 13, 14 and 15 are sectional illustrations of various stages in the manufacture of the integrated circuit device shown in FIG. 12.
Figure 14:
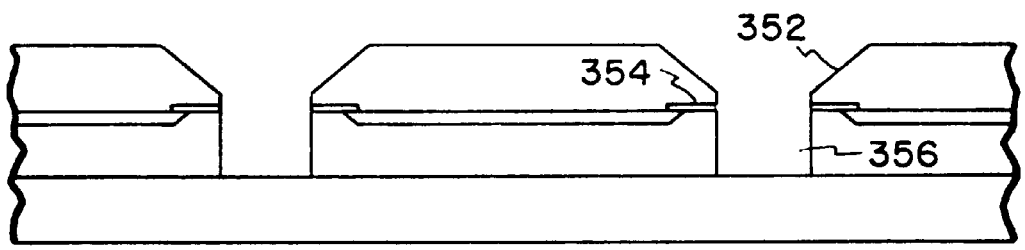
Figure 15:
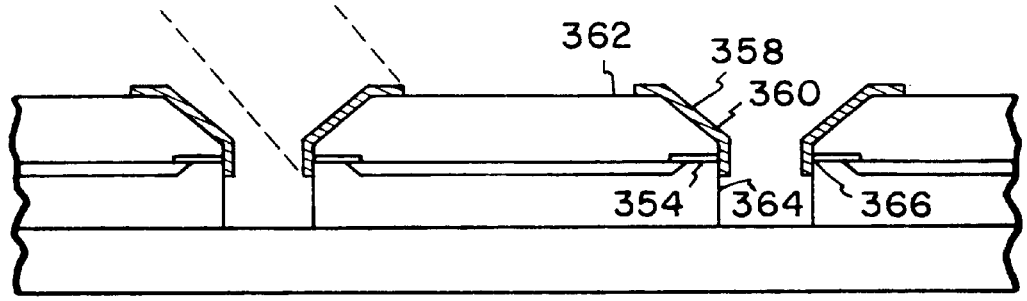

Reference is now made to FIGS. 13, 14 and 15, which illustrate further steps in the manufacture of the integrated circuit devices of FIG. 12 in accordance with a preferred embodiment of the present invention.

FIG. 13 illustrates at reference numeral 350, a preferred cross sectional configuration of a notch 352 produced by partially cutting as described hereinabove in connection with FIG. 4E. In contrast to the embodiment illustrated in FIG. 6, where vertical lines 56 indicate the intersection of the notch 54 with the pads 34, defining exposed sectional pad surfaces 51, in the present embodiment, the notch 352 does not engage pads 354.

FIG. 14 illustrates a subsequent manufacturing step wherein a straight cut 356 is formed at the center of notch 352 and exposes edges of pads 354.

FIG. 15 illustrates the formation of metal contacts 358 along the inclined edges 360, part of the top surface 362 and part of perpendicular side walls 364, which extend perpendicularly to top surface 362. These contacts, which may be formed by any suitable metal deposition technique, are seen to extend inside notch 352 and inside straight cut 356, thus establishing electrical contact with edge surfaces 366 of pads 354.

Here, the metal contacts are formed onto the dies in electrical contact with surfaces 366 of pads 354 after separating the dies into individual chips.

It will be apparent to persons skilled in the art that the present invention is not limited to what has been particularly shown and described hereinabove. Rather the scope of the present invention is defined only by the claims which follow:

I claim:

1. A method for producing integrated circuit devices including the steps of:

producing a plurality of integrated circuits on a wafer having first and second planar surfaces, each of the integrated circuits including a multiplicity of pads;

waferwise attaching to both said surfaces of the wafer a layer of protective material;

thereafter partially cutting into the wafer and the protective material attached thereto, thereby to define notches along outlines of a plurality of prepackaged integrated circuit devices;

forming metal contacts onto the plurality of prepackaged integrated circuit devices while they are still joined together on the wafer, at least a portion of said metal contacts extending into the notches; and thereafter separating the plurality of prepackaged integrated circuit devices into individual devices.

2. A method according to claim 1 and wherein the step of partially cutting exposes sectional surfaces of the multiplicity of pads.

3. A method according to claim 1 and wherein the step of partially cutting cuts pads so as to simultaneously define electrical contact regions for both of a pair of adjacent integrated circuits.

4. A method for producing integrated circuit devices including the steps of:

producing a plurality of integrated circuits on a wafer, each of the integrated circuits including a multiplicity of pads; and thereafter partially cutting the wafer, thereby to define notches along outlines of a plurality of integrated circuits thereby exposing sectional surfaces of the multiplicity of pads.

5. A method according to claim 4 and wherein the step of partially cutting cuts a plurality of pads including some which communicate with a one of a pair of adjacent integrated circuits and others with communication with another of the pair of adjacent integrated circuits, thereby to define electrical contact regions for both of said pair of adjacent integrated circuits.

6. A method according claim 4 and also comprising the steps of providing a conductive layer over notched edges of the integrated circuits in electrical communication with the exposed edges of the pads and wherein portions of the conductive layer communicating with separate ones of the multiplicity of pads are electrically separated from one another.

7. A method according to claim 6 and wherein the step of providing a conductive layer comprises forming a conductive coating also over non-edge portions of the integrated circuit.

8. A method according to claim 4 and wherein the partially cutting step is carried out at locations whereby the silicon substrate is not exposed at the notched edges of the resulting integrated circuits.

9. A method according to claim 4 and wherein prior to the partially cutting step, the integrated circuits are surrounded on their planar surfaces by protective insulation layers and on their edges by epoxy.

10. A method according to claim 4 and wherein a thermal bonding pad is formed on at least one outer planar surface of said integrated circuit devices.

11. A method according to claim 4 and also comprising the step of providing an integrally formed ground plane in said integrated circuit devices.

12. A method according to claim 10 and wherein said protective insulation layer is transparent to radiation which is used for erasing EPROM devices.

13. A method according to claim 12 and also comprising forming metal contacts in mutually staggered relationship onto a planar surface of said integrated circuit.

14. A method according to claim 13 and also comprising forming metal contacts which extend onto surfaces perpendicular to said first and second planar surfaces.

15. Apparatus for producing integrated circuit devices including:

apparatus for producing a plurality of integrated circuits on a wafer having opposite planar surfaces, each of the integrated circuits including a multiplicity of pads;

apparatus for waferwise attaching to both said surfaces of the wafer a layer of protective packaging material; and partially cutting apparatus for thereafter partially cutting the wafer and the protective material attached thereto, thereby to define notches along outlines of a plurality of prepackaged integrated circuit devices;

metal coating apparatus for forming metal contacts onto the plurality of prepackaged integrated circuit devices while they are still joined together on the wafer, at least a portion of the metal contacts extending into the notches; and separating apparatus for thereafter separating the plurality of prepackaged integrated circuit devices into individual devices.

16. Apparatus according to claim 15 and wherein the partially cutting apparatus exposes sectional surfaces of the multiplicity of pads and cuts pads which communicate with adjacent integrated circuits, thereby to simultaneously define electrical contact regions for the adjacent integrated circuits.

17. Apparatus for producing integrated circuit devices including:

apparatus for producing a plurality of integrated circuits on a wafer, each of the integrated circuits including a multiplicity of pads; and partially cutting apparatus for thereafter partially cutting the wafer, thereby to define notches along outlines of a plurality of integrated circuit elements which expose sectional surfaces of the multiplicity of pads.

18. Apparatus according to claim 17 and wherein the partially cutting apparatus cuts a plurality of pads including some which communicate with a one of a pair of adjacent integrated circuits and others with communication with another of the pair of adjacent integrated circuits, thereby to define electrical contact regions for both of said pair of adjacent integrated circuits.

19. Apparatus according to claim 17 and also comprising apparatus for providing a conductive layer over notched edges of the integrated circuit in electrical communication with the edges of the pads and for electrically separating portions of the conductive layer communicating with separate ones of the multiplicity of pads.

20. Apparatus according to claim 19 and wherein the conductive layer comprises a conductive coating over more than the edge of the integrated circuit.

21. Apparatus according to claim 17 and wherein the partially cutting apparatus is operative at locations whereby the silicon substrate is not exposed at the notched edges of the resulting integrated circuits.

22. An integrated circuit device comprising:

an integrated circuit die having top and bottom surfaces formed of electrically insulative and mechanically protective material and electrically insulative edge surfaces having exposed sections of conductive pads and being inclined with respect to the top and bottom surfaces.

23. An integrated circuit device manufactured according to the method of claim 1.

24. An integrated circuit device according to claim 23 and also including at least one of an integrally formed thermal contact to a heat sink on an outer planar surface of the device and an integrally formed ground plane.

25. Apparatus according to claim 15 and also comprising metal contacts arranged in mutually staggered relationship onto a planar surface of said integrated circuit.

26. Apparatus according to claim 15 and also comprising metal contacts which extend onto surfaces perpendicular to said first and second planar surfaces.

* * * * *